United States Patent
Chang (10) Patent No.: US 7,035,157 B2
(45) Date of Patent: Apr. 25, 2006

(54) TEMPERATURE-DEPENDENT DRAM SELF-REFRESH CIRCUIT

(75) Inventor: Chien-Yi Chang, Hsinchu (TW)

(73) Assignee: Elite Semiconductor Memory Technology, Inc., Hsin-Chu (TW)

( * ) Notice: Subject to any disclaimer, the term of this patent is extended or adjusted under 35 U.S.C. 154(b) by 38 days.

(21) Appl. No.: 10/940,231

(22) Filed: Sep. 14, 2004

(65) Prior Publication Data

US 2006/0044910 A1    Mar. 2, 2006

Related U.S. Application Data

(63) Continuation-in-part of application No. 10/927,883, filed on Aug. 27, 2004, now abandoned.

(51) Int. Cl.
*G11C 7/00* (2006.01)
(52) U.S. Cl. .................. 365/222; 365/211; 365/226
(58) Field of Classification Search ........... 365/222, 365/211, 226, 227
See application file for complete search history.

(56) References Cited

U.S. PATENT DOCUMENTS

| | | | |
|---|---|---|---|
| 4,393,477 A * | 7/1983 | Murotani | 365/222 |
| 5,278,796 A | 1/1994 | Tallinghast et al. | |
| 6,281,760 B1 | 8/2001 | Koelling et al. | |
| 6,438,057 B1 * | 8/2002 | Ruckerbauer | 365/222 |
| 6,560,164 B1 | 5/2003 | Kawai et al. | |
| 6,597,614 B1 * | 7/2003 | Nam et al. | 365/222 |

* cited by examiner

*Primary Examiner*—Anh Phung
(74) *Attorney, Agent, or Firm*—Duane Morris LLP (57) ABSTRACT

A device comprising a temperature-dependent self refresh circuit for a memory device is provided where the self refresh circuit includes: a temperature sensor circuit for providing an output that reflects an operation temperature; means for switching the temperature sensor circuit to a low power state during a self refresh operation; an encoder for encoding temperature data from said output; and a programmable oscillator responsive to the encoded data to provide a temperature-dependent refresh signal for the self refresh operation.

24 Claims, 5 Drawing Sheets

TEMPERATURE-DEPENDENT DRAM SELF-REFRESH CIRCUIT

CROSS-REFERENCE TO RELATED APPLICATIONS

This application is a continuation-in-part of and claims priority to U.S. patent application Ser. No. 10/927,833, now abandoned, entitled Temperature-Dependent DRAM Self-Refresh Circuit" filed Aug. 27, 2004, the entirety of which is hereby incorporated by reference herein.

FIELD OF THE INVENTION

The present invention relates to DRAM self-refresh circuits, and more specifically to temperature-dependent DRAM self-refresh circuits and methods of generating temperature-dependent self-refresh signals.

BACKGROUND OF THE INVENTION

Dynamic Random Access Memory (DRAM) devices continue to be a preferred memory for storing data in electronic systems. DRAMs, due to their small memory cell size, can store large amounts of data in very small devices. At the same time, with the advent of low power electronic devices, such as portable computers and the like, the need to reduce power consumption continues to be an important goal for designers of DRAMs.

Refresh operations, however, must be accomplished while addressing two competing interests. First, the refresh operation must restore data values. Frequent refresh operations are desirable to ensure that data are not corrupted. At the same time, the amount of current required to charge the memory cells results in increased power consumption. Therefore, frequent refresh operations are not desirable as they consume power. These competing interests result in each memory cell being refreshed before a maximum theoretical "pause" time passes.

In a typical DRAM array, the memory cells of the same row are accessed by activating a word line common to the row. Because of this, the memory cells are refreshed on a row-by-row basis. To ensure that each row is refreshed, the DRAM typically includes a "refresh" counter. The refresh counter is set to an initial row address, resulting in the initial row being refreshed. Under control of a refresh clock, the refresh counter is then changed (typically by an increment or decrement operation) to a next row address. This results in the next row address being refreshed. Once a last row address has been reached, the refresh counter returns to the initial row address. In this manner, under control of the refresh clock, the refresh counter cycles through all of the rows in the memory device. The speed of the refresh counter, therefore, determines the rate at which memory cells are refreshed. In order to meet the maximum pause time, the refresh counter must typically cycle through all of the row addresses within the maximum pause time. The refresh clock controls the speed of the refresh counter. If the maximum pause time (the maximum time for which stored data do not corrupt) is T and there are X rows, then the counter period is T/X.

A DRAM device can be expected to operate over a range of temperatures. This gives rise to a problem associated with prior art refresh circuits. While the maximum pause time may be a certain value at one temperature, it can be a different value at another temperature. The pause time of a DRAM cell has been found to roughly double for every 12–15° C. drop in temperature. Thus, as the operating temperature drops, the memory cells do not need to be refreshed as frequently. Therefore, if refresh rates can be adjusted for temperature, DRAM power consumption may be lessened, which is especially desirable for battery powered devices.

U.S. Pat. No. 6,560,164, U.S. Pat. No. 6,281,760 and U.S. Pat. No. 5,278,796, the entirety of which are hereby incorporated by reference herein, describe circuits that adjust the DRAM refresh rate based on the ambient temperature in order to reduce the power consumed by refreshing the memory cells. The temperature sensors of these prior art circuits detect temperature constantly, rendering the temperature sensor always "on" or "active" and thus constantly consuming power.

Therefore, there remains a need for an improved less power consumption temperature-dependent refresh circuit and temperature-dependent method of refreshing memory cells.

SUMMARY OF THE INVENTION

A device comprising a temperature-dependent self refresh circuit for a memory device is provided where the self refresh circuit includes: a temperature sensor circuit for providing an output that reflects an operation temperature; means for switching the temperature sensor circuit to a low power state during a self refresh operation; an encoder for encoding temperature data from said output; and a programmable oscillator responsive to the encoded data to provide a temperature-dependent refresh signal for the self refresh operation.

A method of generating a temperature-dependent refresh signal for a memory device is also provided. The method includes the steps of: providing a temperature sensor for providing an output that reflects an operating temperature of the device; switching the temperature sensor to a low power state during a self refresh operation; encoding temperature data from the output; and utilizing the encoded data to program an oscillator to provide a temperature-dependent refresh signal for the self refresh operation.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
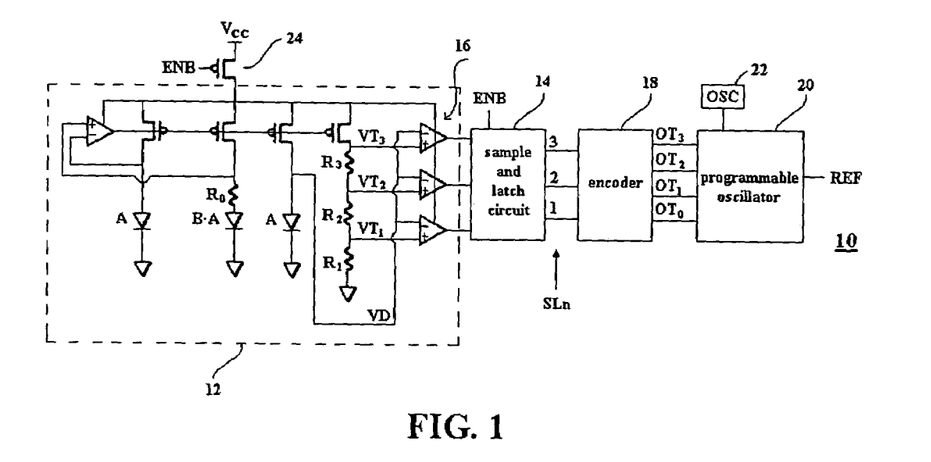
FIG. 1 is a circuit diagram of an exemplary circuit for generating a temperature-dependent memory cell refresh signal.

FIG. 1 is a circuit diagram of an exemplary embodiment of a temperature-dependent refresh signal generator 10. The circuit 10 generates a temperature-dependent refresh signal REF for controlling the refresh rate of memory cells in a memory array. In an exemplary use, the refresh generation circuit 10 is included in the DRAM that is used in a battery powered device, preferably a portable device such as a notebook computer or any other device that is battery powered and has power consumption considerations.

The reference signal generator 10 includes a temperature sensor circuit 12 for generating a temperature detection output signal that is provided to a sample-and-latch circuit 14 via comparator circuit 16. The refresh signal generator 10 also includes an encoding circuit 18 for receiving and encoding the sampled and latched data from the sample-and-latch circuit 14, and a programmable oscillator circuit 20, which provides the temperature-dependent refresh signal ('REF') from a clock signal provided by oscillator 22 as controlled by the code signal provided by encoder 18.

The operation of the sensor circuit 12 should be familiar to those in the art and its operation is not discussed in such detail as to obscure the present invention. Voltage signals VT1, VT2 and VT3 are constant reference voltages produced by a resistance ladder including reference resistors R3, R2 and R1. The voltages are provided to comparator circuit 16 for comparison with voltage VD to determine within what range voltage VD lies. Voltage VD is a temperature-dependent voltage. If the sensor circuit is turned on, there is current passing through diode (A). Therefore, the diode (A) generates VD.

Figure 4:
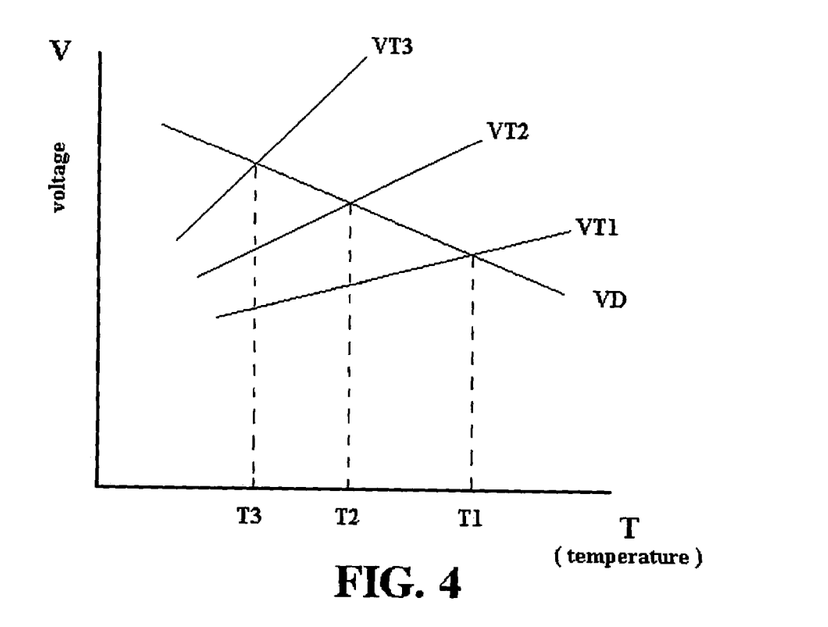
FIG. 4 is graph of temperature-voltage characteristic of the temperature sensor of the generation circuit of FIG. 1.

FIG. 4 is a voltage-temperature characteristic curve diagram. The inclined rate of VD (i.e., d VD/dT) is about −0.0015 V/° C., i.e., voltage VD drops as temperature increases, as determined by simulation. The inclined rates of VTn (e.g., VT3, VT2 and VT1) satisfy the following equation:

$$\frac{dV_{T(n)}}{dT} = \frac{K}{q} \cdot \ln(B) \cdot \frac{\sum_{1}^{n} R_n}{Ro}$$

where K is constant, q is electron charge and B is the number of diodes A of diode section BA in circuit 12 of FIG. 1. In one example, B=50. Therefore, the resistance of the resistors Rn (i.e., R1, R2 and R3) can be selected to match a desired Voltage-Temperature characteristic curve shown in FIG. 4.

When enable signal ENB goes low, the temperature sensor circuit 12 is turned on. In one embodiment, there are three comparators in comparator circuit 16 coupled as shown in FIG. 1 with their negative (−) voltage inputs (Vn) each coupled to the temperature-dependent voltage node to receive VD and their positive (+) voltage inputs (Vp) coupled to VT3, VT2 and VT1, respectively. If Vp>Vn of a comparator, the output of the comparator is a logic high. Conversely, if Vp<Vn, the output of the comparator is a logic low. FIG. 4 illustrates the following conditions:

(i) if T>T1, then VT3>VT2>VT1>VD, and all three comparators in comparator circuit 16 output logic high;

(ii) if T1>T>T2, then VT3>VT2>VD>VT1, and the comparator coupled to VT1 outputs logic low and the other two comparators output logic high;

(iii) if T2>T>T3, then VT3>VD>VT2>VT1, and the comparators coupled to VT1 and VT2 output logic low and the other comparator outputs logic high; and (iv) if T<T3, then VD>VT3>VT2>VT1, and all three comparators output logic low.

Figure 2:
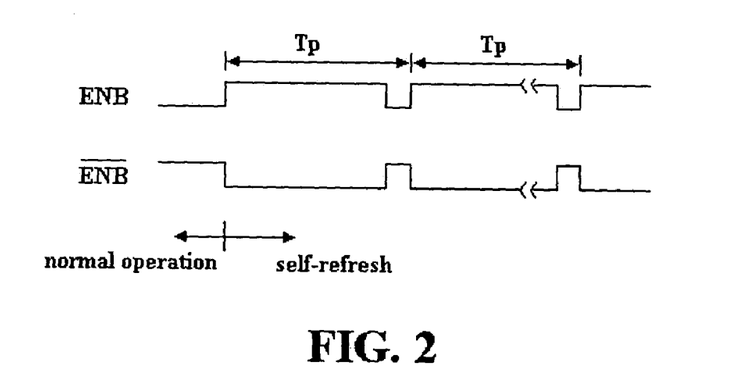
FIG. 2 is a timing diagram of an enable signal for the temperature sensor of the refresh signal generation circuit of FIG. 1.

FIG. 2 shows an exemplary Enable signal (ENB) for temperature sensor 12. ENB is logic low during the normal operation, i.e., non self-refresh operation, of the memory and goes logic high at the beginning of the self refresh operation. ENB returns to low after the self refresh cycle. When ENB is low, PMOS transistor switch 24 is turned on and the temperature sensor circuit 12 is powered on, thereby producing reference voltage signals VT1, VT2 and VT3 and temperature-dependent voltage signal VD. When ENB is high, then the outputs of the comparators are sampled and latched into sample and latch circuit 14. PMOS switch 24 is turned off and the temperature sensor circuit 12 enters a low power state, e.g., is powered off, thereby conserving power during the self refresh cycle. During normal operation, it is an option to turn on ENB because the power consumption from the temperature sensor is negligible compared with the rest of the circuit operation.

In one embodiment, during the refresh cycle, the ENB signal is periodically (i.e., every period Tp) forced low for a short period of time in order to re-power temperature sensor circuit 12 to detect any changes in temperature during the refresh cycle, thereby dynamically changing the refresh cycle in response to chip temperature during the refresh operation. Alternatively, the enable signal could remain high for the entire refresh cycle.

Figure 3A:
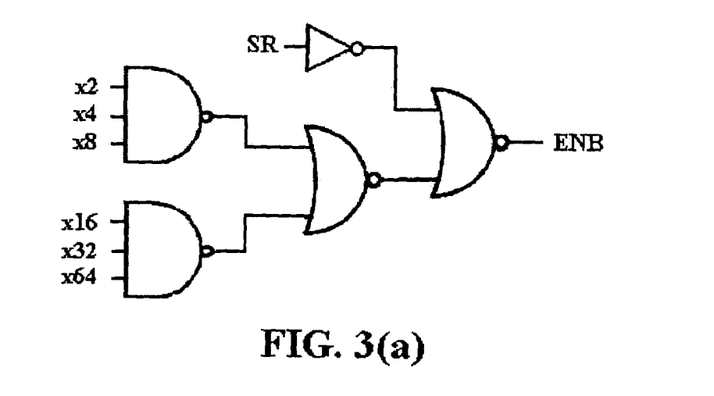
FIG. 3(a) illustrates a circuit for generating the enable signal of FIG. 2
Figure 3B:
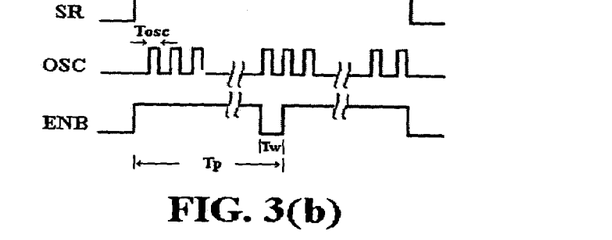
FIG. 3(b) is a timing diagram showing the generated enable signal, a self refresh signal and a clock signal.

FIGS. 3(a) and 3(b) illustrate an exemplary method of generating the enable signal ENB shown in FIG. 2. A self refresh signal SR of constant frequency (not to be confused with temperature-dependent refresh signal REF) may be provided from, for example, a microcontroller. The SR signal is shown in FIG. 3(b). In one embodiment, the constant self refresh signal SR may be provided by a microcontroller. The microcontroller, as is conventional, controls the SR status in order to save current. For example, the SR signal may be set to always "high" at the standby status of a cell phone. In FIGS. 3(a) and 3(b), period Tp can equal, for example, 126*Tosc, whereas Tw can equal 2*Tosc. Because Tw controls the powering "on" of the temperature sensor, Tw cannot be too short such that the sensor does not have sufficient time to turn on. If Tw is too short, the sensor might not turn on and remain in the power "off" state, at which time the sample and latch circuit 14 may receive incorrect data. Signals X2 through X64 are explained in detail below with respect to FIGS. 7 and 8. In this embodiment, Tp=126*Tosc (i.e., the sum of periodic signals X2+X4+X8+X16+X32+X64), and Tw=2*Tosc. Tw has the period of the smallest periodical signal X2 provides to the circuit of FIG. 3(a).

Figure 5:
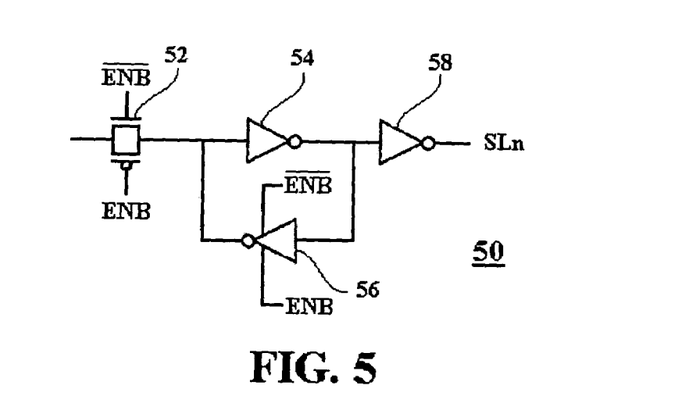
FIG. 5 is a circuit diagram of a sampling and latch circuit.

Referring to FIG. 5, an exemplary embodiment of a sampler/latch 50 is shown. In the embodiment of FIG. 1, the sample-and-latch circuit 14 preferably includes three sampler/latch circuits 50, with one each coupled to a respective comparator output from comparator circuit 16 and providing respective sampling and latch output SLn of circuit 14 (labeled outputs SL1, SL2, and SL3 in FIG. 1). Each sampler/latch 50 includes a pass gate 52 comprising an NMOS transistor and a PMOS transistor. The pass gate is opened (i.e., "on") for circuit to sample data and closed (i.e., "off") for the circuit to latch and hold data. The pass gate 52 is coupled to a pair of cross-coupled inverters 54 and 56, which in turn are coupled to inverter 58. Inverter 56 is coupled to both ENB and inverted ENB and works while ENB is at logic HIGH. Inverters 54 and 58 are always on. When ENB goes low, the sampler/latch 50 receives the output signal of the comparator to which it is coupled. When ENB goes high, the outputs of the comparators are undetermined (because the temperature sensor circuit is off as described above), and the latch 50 latches the last received output signal of the comparator to which it is coupled. The sample-and-latch circuit is used because the sensor circuit is not always "on". Therefore, when the sensor circuit is turned off, the sample-and-latch circuit latches the latest inputted data and transmits it to the encoding circuit until the sensor circuit is turned back "on." The sample and latch circuit 14, through the plurality of sampler/latch circuits 50, samples temperature data from the output of the sensor circuit 12, as interpreted by comparator circuit 16, for encoding by the encoder 18. When the temperature sensor is "off", i.e., when ENB is logic high, the sample-and-latch circuit 14 latches the last received temperature data for encoding by the encoder 18.

Figure 6:
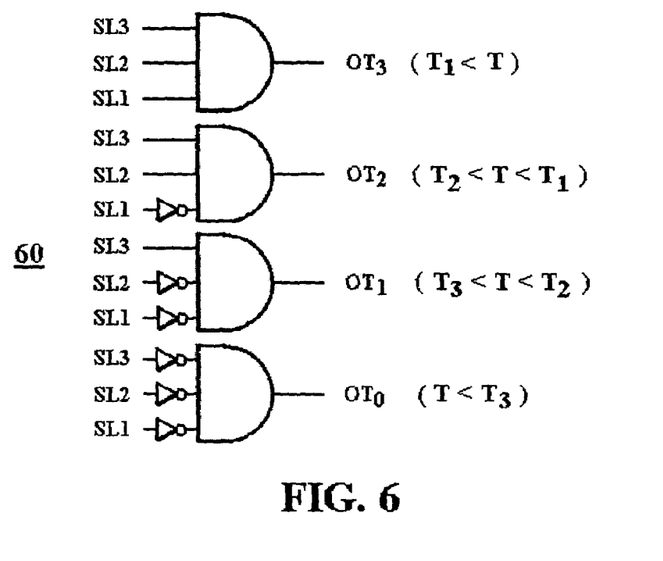
FIG. 6 illustrates an embodiment of an exemplary encoding circuit.

FIG. 6 illustrates an exemplary embodiment of encoding circuit 18. In this embodiment, the encoding circuit includes circuit 60 comprising a plurality of NAND circuits that provide outputs OT0, OT1, OT2, and OT3 reflective of the temperature condition T, which is detected by the temperature sensor 12 and sampled and latched from comparator circuit 16 by sampling and latch circuit 14. There are three sampling and latch outputs SL1, SL2, and SL3 that are indicative of within what temperature range temperature T lies. As described above, if T1<T, all three SL outputs are logic "1" (because all three comparator outputs are from comparator circuit 16 produce logic "1" while the temperature sensor is on for this temperature condition), and only OT3 is a logic "1". If T2<T<T1, SL1 and SL2 are logic "1" and level 3 is logic "0". Only OT2 is a logic "1". If T3<T<T2, SL1 is logic "1" and SL2 and SL3 are logic "0". Only OT1 is a logic "1". Last, if T<T3, all SL outputs are logic "0" and only OT1 is a logic "1". Therefore, the temperature range is reflected by the outputs of the AND gates of circuit 60.

Figure 7:
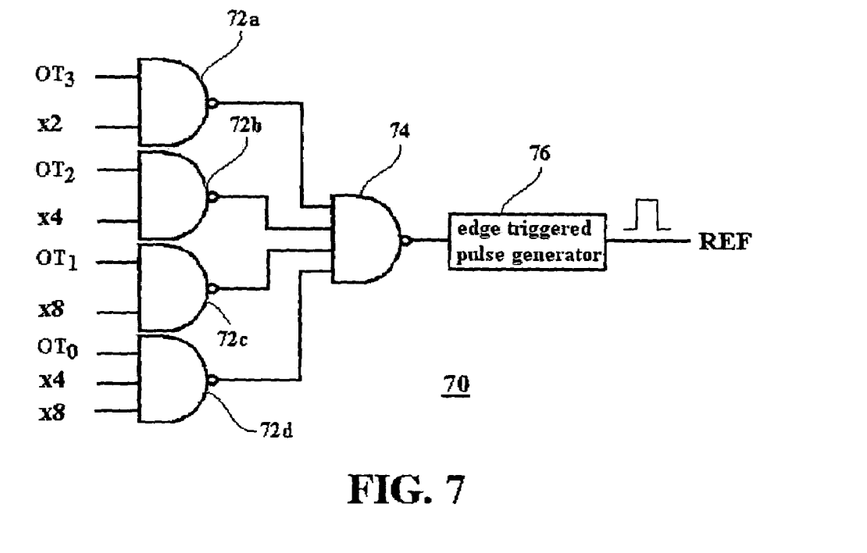
FIG. 7 illustrates an embodiment of an exemplary programmable pulse generator.

FIG. 7 illustrates an exemplary embodiment of a programmable oscillator 70. The oscillator 70 includes a plurality of NAND gates $72a$ through $72d$ coupled to control signal OT3 through OT0, respectively. The output of each NAND gate 72 is coupled to a NAND gate 74, which is coupled to an Edge Triggered Pulse Generator 76. NAND gates 72 are each coupled to clock signals having different clock periods, e.g., signals X2, X4, X8 and X4 and X8. The clock periods T(Xn) of the clock signals Xn have the following relationship: T(X2)<T(X4)<T(X8). Therefore, the frequency of a clock signal X2 is greater than the frequency of a clock signal X4, etc. When T1<T, only OT3 is high and Edge Triggered Pulse Generator 76 receives high frequency clock signal X2 from NAND gate 72 and through NAND gate 74. The Edge Triggered Pulse generator 76 generates temperature-dependent refresh signal REF in accordance with clock X2 (which has short period but high frequency) for refreshing a word line of a DRAM cell. In essence, because the temperature is high, the refresh frequency must be high. In another example, when T<T3, only OT0 is high and Edge Triggered Pulse Generator 76 receives signal X12, i.e., NAND gate $72d$ provides signal X12 to Edge Triggered Pulse Generator 76 from signals OT0 (which is high) and signals X4 and X8. Edge Triggered Pulse Generator 76 generates temperature-dependent refresh signal REF in accordance with low frequency clock signal X12. In this example, REF has low frequency because the temperature is low. The operation of and designs for Edge Triggered Pulse Generator 76 should be familiar to those in the art.

Figure 9:
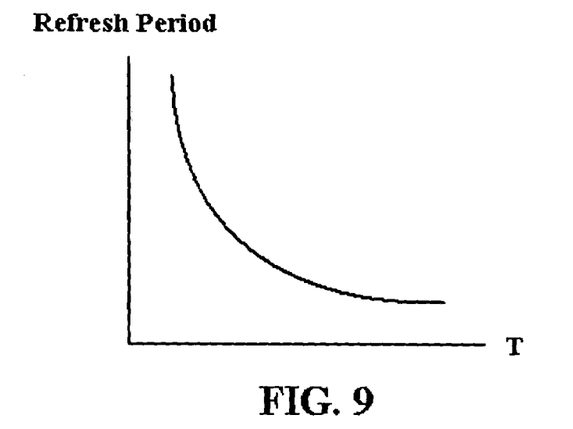
FIG. 9 is a graph of an exemplary temperature-refresh period characteristic for the circuit of FIG. 1.

FIG. 9 is a curve of refresh period verses Temperature (T) for the circuit of FIG. 1 plotted from sample experimental data. As can be seen, the refresh period decreases (meaning the refresh frequency increases) as temperature increases.

Figure 8:
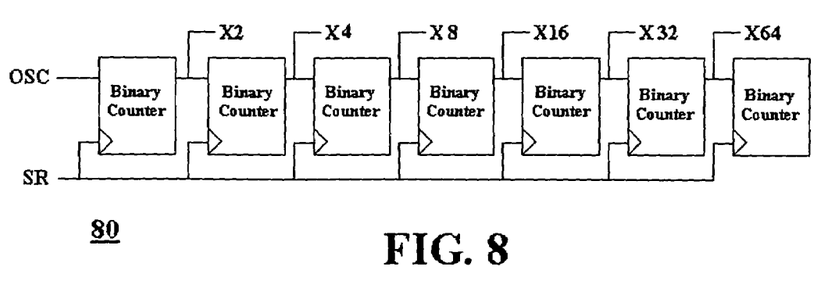
FIG. 8 illustrates an embodiment of an exemplary circuit for generating clock signals of different frequencies.
Figure 12:
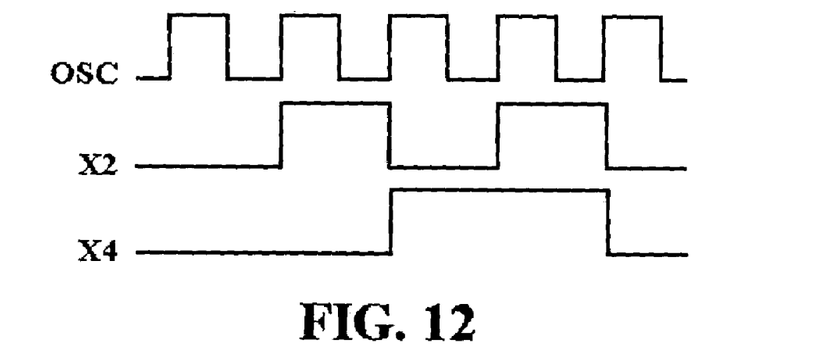
FIG. 12 is a timing diagram showing several related clock signals.

FIG. 8 illustrates a circuit 80 for generating the clock signals X2, X4, etc. The rate of signals X2, X4, etc. . . . can be varied and set by design. The circuit 80 includes a plurality of series coupled binary counters, which in one embodiment, divide each received signal by two as shown in, for example, FIG. 12. The circuit is coupled to oscillator signal OSC, which is provided by oscillator 22 (FIG. 1) in one embodiment. The first binary counter receives the OSC clock signal and outputs a signal Xn at 1/n of the frequency of the clock signal in the following stages, as illustrated in FIGS. 8 and 12.

As shown in FIG. 8, in one embodiment, the SR signal is also used as a reset signal for resetting the binary counters. When the SR signal goes high, the binary counters are reset into their initial status for determining a new ENB signal (see FIG. 3(b)), which is dependent on REF, to control the sensor circuit. If the binary counters are not reset, subsequent outputs will be divided accordingly.

The inputs to the NAND gates 72 of FIG. 7 and the frequency of OSC of FIG. 8 can be selected to provide desired frequency control signals to Pulse Generator 76 under selected temperature conditions. For example, if the four frequency choices for the control signal are X2, X4, X6 and X8, comparator $72a$ is coupled to X2, comparator $72b$ is coupled to X4, comparator $72c$ is coupled to X2 and X4 and comparator $72d$ is coupled to X8. The control signals can be selected based on the desired refresh characteristics and temperature ranges associated therewith.

Figure 10:
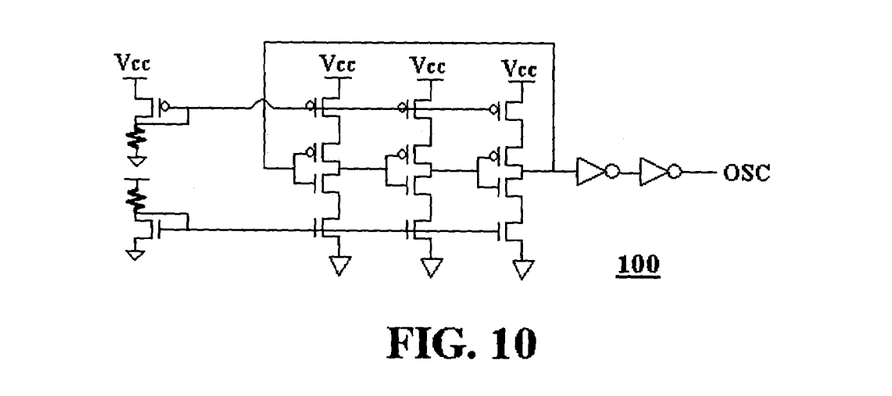
FIG. 10 is a circuit diagram of an exemplary oscillator circuit.

FIG. 10 is a circuit diagram of an exemplary oscillator 100, which may be included in oscillator block 22 in FIG. 1. The design of oscillator 100 should be familiar to those in the art and is not detailed herein. Oscillator 100 provides constant clock signal OSC to programmable oscillator 20 through a feedback loop.

Figure 11:
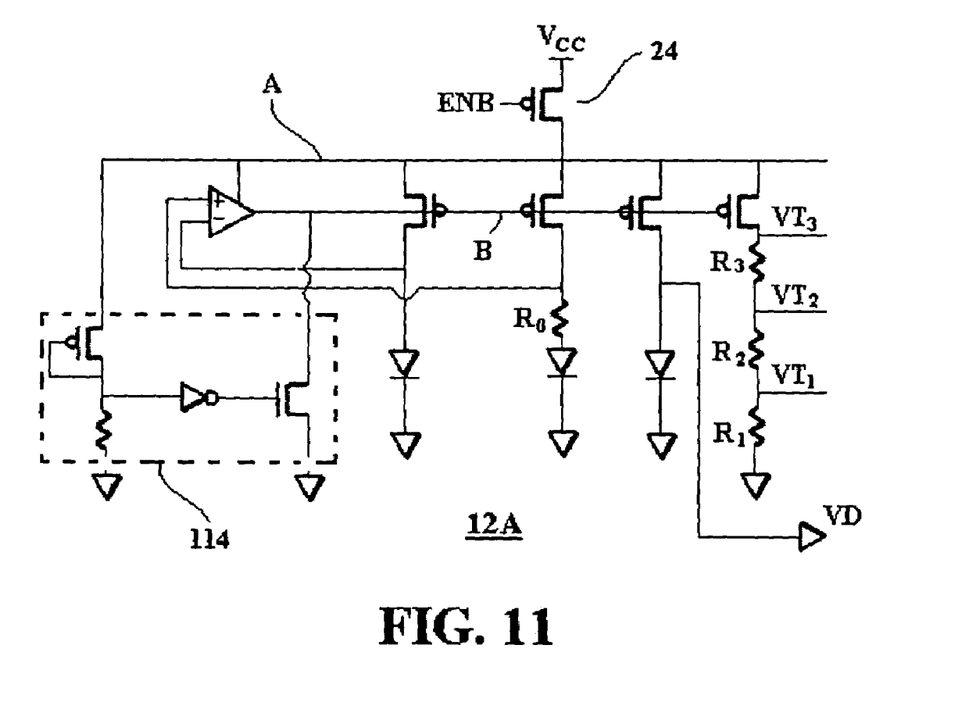
FIG. 11 is a circuit diagram of an alternative embodiment of a temperature sensor circuit.

Referring to FIG. 11, another preferred embodiment of a temperature sensor 12A is designated. The sensor circuit 12A of FIG. 11 is identical to the sensor circuit 12 of FIG. 1, only start up circuit 114 is provided. When ENB goes to low, the line A is provided (through PMOS transistor switch 24) with the voltage to power on the temperature sensor 110. However, the line designated B may, in some circumstances, be pulled to a high voltage by the line A because of the presence of parasitic capacitances, resulting in the temperature sensor not properly turning on. A start up circuit 114 is provided in this embodiment to pull the line B's voltage to a low (i.e., logic "0") value and then shut down when the temperature sensor turns on. The output of the operational amplifier (OP AMP) of the temperature sensor circuit will be high when its inputs are in the same logic (both low or high). At first, the OP AMP's inputs are both low and cause the OP AMP's output to be high. In this case, point B is high and renders the sensor circuit always off. The start up circuit forces point B to LOW at start up to ensure the sensor circuit turns on at first.

Although the embodiments illustrated above describe four possible temperature conditions, i.e., (i) T<T3, (ii) T3<T<T2<T1; (iii) T3<T2<T<T1; and (iv) T1<T, this is for purpose of illustration only. Other numbers of possible temperature combinations can be used by adding (or even subtracting) resistors from the resistor ladder of temperature sensor 12, and adding corresponding comparators to comparator circuit 16, sampler/latch circuits 50 to sample and latch circuit 14, AND gates to encoder 60, and input NAND gates 72 to programmable oscillator 70.

Although not shown, the temperature-dependent refresh clock signal REF is provided to activate a wordline and toggle the refresh address counter, such as described in the background section and known in the art, for rewriting stored data in memory cells, such as a DRAM memory, in accordance with the refresh clock signal. REF is used to control the bit line refresh. Also, the refresh clock signal generator is preferably embodied in an integrated circuit.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A device comprising a temperature-dependent self refresh circuit for a memory devices said self refresh circuit comprising:
    a temperature sensor circuit for providing an output that reflects an operation temperature;
    means for switching said temperature sensor circuit to a low power state during a self refresh operation;
    an encoder for encoding temperature data from said output; and
    a programmable oscillator responsive to said encoded data to provide a temperature-dependent refresh signal for said self refresh operation.

2. The device of claim 1, wherein said self refresh circuit further comprises:
    a sample-and-latch circuit coupled between said temperature sensor circuit and said encoder, said sample-and-latch circuit sampling a signal indicative of said output of said temperature sensor circuit to provide said temperature data for said encoder, said sample and latch circuit further latching said temperature data for said encoder when said temperature sensor circuit is switched to said low power state.

3. The device of claim 2,
    wherein said temperature sensor circuit comprises means for providing a temperature dependent voltage signal,
    said device further comprising a comparison circuit for comparing said temperature dependent voltage with a plurality of reference voltages, whereby said comparison circuit provides said signal indicative of said output of said temperature sensor circuit.

4. The device of claim 1, wherein said switching means comprises a switch coupled between a power supply and said sensor circuit, said switch being responsive to an enable signal indicating said self refresh operation.

5. The device of claim 4, wherein said switch comprises a MOS transistor biased with said enable signal indicating said self refresh operation.

6. The device of claim 1, wherein said switching means is responsive to an enable signal indicating said self refresh operation, wherein said enable signal switches logic states at least once during said self refresh operation for a time period, whereby said switching means switches said sensor circuit on for said time period.

7. The device of claim 6, further comprising means for generating said enable signal.

8. The device of claim 1, wherein said encoder comprises a plurality of NAND gates, each of said NAND gates providing an output representative of said operation temperature being within a respective temperature range.

9. The device of claim 1, wherein said programmable oscillator comprises a pulse generator and means responsive to said encoded data for coupling said pulse generator to one of a plurality of control clock signals.

10. The device of claim 9, further comprising means for generating said plurality of control clock signals.

11. The device of claim 1, further comprising a DRAM memory array.

12. A method of generating a temperature-dependent refresh signal for a memory device, said method comprising the steps of:
    providing a temperature sensor for providing an output that reflects an operating temperature of said device;
    switching said temperature sensor to a low power state during a self refresh operation;
    encoding temperature data from said output; and
    utilizing said encoded data to program an oscillator to provide a temperature-dependent refresh signal for said self refresh operation.

13. The method of claim 12, further comprising the steps of:
    sampling a signal indicative of said output from said temperature sensor to provide said temperature data for encoding; and
    latching said temperature data for encoding when said temperature sensor circuit is switched to said low power state.

14. The method of claim 12, said output form said temperature sensor circuit comprises a temperature dependent voltage signal, the method further comprising the steps of:
    comparing said temperature dependent voltage signal with a plurality of reference voltages, whereby said signal indicative of said output of said temperature sensor circuit is provided.

15. The method of claim 12, wherein said switching step is performed responsive to an enable signal indicating said self refresh operation.

16. The method of claim 14, wherein said enable signal switches logic states at least once during said self refresh operation for a time period, whereby said sensor circuit is switched on for said time period.

17. The method of claim 12, wherein said memory device comprises a DRAM memory device.

18. A memory device comprising:
    a DRAM memory array; and
    a temperature-dependent self refresh circuit for said DRAM memory array, said self refresh circuit comprising:
        a temperature sensor circuit for providing an output that reflects an operating temperature of said DRAM memory array;
        means for switching said temperature sensor circuit to a low power state responsive to an enable signal indicating a self refresh operation;

an encoder for encoding temperature data from said output;

a sample and latch circuit coupled to sample a signal indicative of said output of said temperature sensor circuit to provide temperature data to said encoder, said sample and latch circuit further latching said temperature data for said encoder when said temperature sensor circuit is switched to said low power state; and a programmable oscillator responsive to said encoded data to provide a temperature-dependent refresh signal for said self refresh operation.

19. The device of claim 18, wherein said output of said temperature sensor circuit comprises a temperature dependent voltage signal, said device further comprising a comparison circuit for comparing said temperature dependent voltage with a plurality of reference voltages, whereby said comparison circuit provides said signal indicative of said output of said temperature sensor circuit for said sample and latch circuit.

20. The device of claim 18, wherein said enable signal switches logic states at least once during said self refresh operation for a time period, whereby said switching means switches said sensor circuit on for said time period.

21. The device of claim 20, further comprising means for generating said enable signal.

22. The device of claim 18, wherein said encoder comprises a plurality of NAND gates, each of said NAND gates providing an output representative of said operation temperature being within a respective temperature range.

23. The device of claim 18, wherein said programmable oscillator comprises a pulse generator and means responsive to said encoded data for coupling said pulse generator to one of a plurality of control clock signals.

24. The device of claim 23, further comprising means for generating said plurality of control clock signals.

* * * * *